US012593627B2

(12) United States Patent
Wong et al.

(10) Patent No.: US 12,593,627 B2
(45) Date of Patent: Mar. 31, 2026

(54) TUNGSTEN DEFLUORINATION BY HIGH PRESSURE TREATMENT

(71) Applicant: Applied Materials, Inc., Santa Clara, CA (US)

(72) Inventors: Keith Tatseun Wong, Los Gatos, CA (US); Thomas Jongwan Kwon, Dublin, CA (US); Sean Kang, Santa Clara, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/202,838

(22) Filed: May 26, 2023

(65) Prior Publication Data

US 2023/0298893 A1     Sep. 21, 2023

Related U.S. Application Data

(60) Continuation of application No. 16/696,229, filed on Nov. 26, 2019, now Pat. No. 11,705,337, which is a
(Continued)

(51) Int. Cl.
*H01L 21/285*        (2006.01)
*C23C 16/08*         (2006.01)
(Continued)

(52) U.S. Cl.
CPC ........ *H01L 21/28556* (2013.01); *C23C 16/08* (2013.01); *C23C 16/14* (2013.01);
(Continued)

(58) Field of Classification Search
CPC ......... C23C 16/08; C23C 16/14; C23C 16/56; H01L 21/28556; H01L 21/28568;
(Continued)

(56) References Cited

U.S. PATENT DOCUMENTS

| | | | |
|---|---|---|---|
| 3,684,592 A | 8/1972 | Chang et al. | |
| 3,749,383 A | 7/1973 | Voigt et al. | |
| | (Continued) | | |

FOREIGN PATENT DOCUMENTS

| | | | |
|---|---|---|---|
| CN | 1280875 C | 10/2006 | |
| CN | 101871043 A | 10/2010 | |
| | (Continued) | | |

OTHER PUBLICATIONS

Chinese Office Action dated Jun. 28, 2023 for Application No. 201880034565.8.

(Continued)

*Primary Examiner* — Vy T Nguyen
(74) *Attorney, Agent, or Firm* — Patterson + Sheridan, LLP

(57)            ABSTRACT

An annealing system is provided that includes a chamber body that defines a chamber, a support to hold a workpiece and a robot to insert the workpiece into the chamber. The annealing system also includes a first gas supply to provide a hydrogen gas, a pressure source coupled to the chamber to raise a pressure in the chamber to at least 5 atmospheres, and a controller configured to cause the robot to transport a workpiece having a metal film thereon into the chamber, where the metal film contains fluorine on a surface or embedded within the metal film, to cause the first gas supply to supply the hydrogen gas to the chamber and form atomic hydrogen therein, and to cause the pressure source to raise a pressure in the chamber to at least 5 atmospheres while the workpiece is held on the support in the chamber.

20 Claims, 4 Drawing Sheets

Related U.S. Application Data division of application No. 15/605,769, filed on May 25, 2017, now Pat. No. 10,622,214.

(51) Int. Cl.

| | |
|---|---|
| *C23C 16/14* | (2006.01) |
| *C23C 16/56* | (2006.01) |
| *H01L 21/768* | (2006.01) |
| *H10B 41/20* | (2023.01) |
| *H10B 43/20* | (2023.01) |
| *H10B 69/00* | (2023.01) |

(52) U.S. Cl.

CPC ........ *C23C 16/56* (2013.01); *H01L 21/28568* (2013.01); *H01L 21/76883* (2013.01); *H10B 69/00* (2023.02); *H10B 41/20* (2023.02); *H10B 43/20* (2023.02)

(58) Field of Classification Search

CPC ............. H01L 21/76883; H01L 21/321; H01L 21/67126; H01L 21/68785; H10B 41/20; H10B 69/00; H10B 43/20

USPC ................................. 219/385, 200; 438/585

See application file for complete search history.

(56) References Cited

U.S. PATENT DOCUMENTS

| | | | |
|---|---|---|---|
| 3,758,316 | A | 9/1973 | Sowards et al. |
| 4,409,260 | A | 10/1983 | Pastor et al. |
| 4,424,101 | A | 1/1984 | Nowicki |
| 4,524,587 | A | 6/1985 | Kantor |
| 4,576,652 | A | 3/1986 | Hovel et al. |
| 4,589,193 | A | 5/1986 | Goth et al. |
| 4,879,259 | A | 11/1989 | Reynolds et al. |
| 5,050,540 | A | 9/1991 | Lindberg |
| 5,114,513 | A | 5/1992 | Hosokawa et al. |
| 5,126,117 | A | 6/1992 | Schumacher et al. |
| 5,149,378 | A | 9/1992 | Ohmi et al. |
| 5,167,717 | A | 12/1992 | Boitnott |
| 5,175,123 | A | 12/1992 | Vasquez et al. |
| 5,207,836 | A | 5/1993 | Chang |
| 5,300,320 | A | 4/1994 | Barron et al. |
| 5,314,541 | A | 5/1994 | Saito et al. |
| 5,319,212 | A | 6/1994 | Tokoro |
| 5,366,905 | A | 11/1994 | Mukai |
| 5,472,812 | A | 12/1995 | Sekine |
| 5,578,132 | A | 11/1996 | Yamaga et al. |
| 5,590,695 | A | 1/1997 | Siegele et al. |
| 5,597,439 | A | 1/1997 | Salzman |
| 5,620,524 | A | 4/1997 | Fan et al. |
| 5,677,230 | A | 10/1997 | Weitzel et al. |
| 5,747,383 | A | 5/1998 | Chen et al. |
| 5,769,952 | A | 6/1998 | Komino |
| 5,808,245 | A | 9/1998 | Wiese et al. |
| 5,857,368 | A | 1/1999 | Grunes et al. |
| 5,858,051 | A | 1/1999 | Komiyama et al. |
| 5,877,087 | A | 3/1999 | Mosely et al. |
| 5,879,756 | A | 3/1999 | Fathi et al. |
| 5,880,041 | A | 3/1999 | Ong |
| 5,886,864 | A | 3/1999 | Dvorsky |
| 5,888,888 | A | 3/1999 | Talwar et al. |
| 5,918,149 | A | 6/1999 | Besser et al. |
| 5,940,985 | A | 8/1999 | Kamikawa et al. |
| 6,037,263 | A | 3/2000 | Chang |
| 6,071,810 | A | 6/2000 | Wada et al. |
| 6,077,571 | A | 6/2000 | Kaloyeros |
| 6,082,950 | A | 7/2000 | Altwood et al. |
| 6,086,730 | A | 7/2000 | Liu |
| 6,095,741 | A | 8/2000 | Kroeker et al. |
| 6,103,585 | A | 8/2000 | Michaelis |
| 6,136,664 | A | 10/2000 | Economikos et al. |
| 6,140,235 | A | 10/2000 | Yao et al. |
| 6,150,286 | A | 11/2000 | Sun et al. |
| 6,164,412 | A | 12/2000 | Allman |
| 6,207,487 | B1 | 3/2001 | Kim et al. |
| 6,242,368 | B1 | 6/2001 | Holmer et al. |
| 6,242,808 | B1 | 6/2001 | Shimizu et al. |
| 6,251,242 | B1 | 6/2001 | Fu et al. |
| 6,251,751 | B1 | 6/2001 | Chu et al. |
| 6,277,249 | B1 | 8/2001 | Gopalraja et al. |
| 6,284,646 | B1 | 9/2001 | Leem |
| 6,299,753 | B1 | 10/2001 | Chao et al. |
| 6,305,314 | B1 | 10/2001 | Sneh et al. |
| 6,319,766 | B1 | 11/2001 | Bakli et al. |
| 6,319,847 | B1 | 11/2001 | Ishikawa |
| 6,334,249 | B2 | 1/2002 | Hsu |
| 6,334,266 | B1 | 1/2002 | Moritz et al. |
| 6,335,240 | B1 | 1/2002 | Kim et al. |
| 6,344,249 | B1 | 2/2002 | Maruyama et al. |
| 6,344,419 | B1 | 2/2002 | Forster et al. |
| 6,348,376 | B2 | 2/2002 | Lim et al. |
| 6,355,558 | B1 | 3/2002 | Dixit |
| 6,358,829 | B2 | 3/2002 | Yoon et al. |
| 6,368,412 | B1 | 4/2002 | Gomi |
| 6,372,598 | B2 | 4/2002 | Kang et al. |
| 6,387,764 | B1 | 5/2002 | Curtis et al. |
| 6,399,486 | B1 | 6/2002 | Chen et al. |
| 6,399,491 | B2 | 6/2002 | Jeon et al. |
| 6,416,822 | B1 | 7/2002 | Chiang et al. |
| 6,428,859 | B1 | 8/2002 | Chiang et al. |
| 6,433,308 | B1 | 8/2002 | Ishigaki et al. |
| 6,442,980 | B2 | 9/2002 | Preston et al. |
| 6,451,119 | B2 | 9/2002 | Sneh et al. |
| 6,451,695 | B2 | 9/2002 | Sneh |
| 6,458,701 | B1 | 10/2002 | Chae et al. |
| 6,464,779 | B1 | 10/2002 | Powell et al. |
| 6,468,490 | B1 | 10/2002 | Shamouilian et al. |
| 6,468,924 | B2 | 10/2002 | Lee et al. |
| 6,475,910 | B1 | 11/2002 | Sneh |
| 6,478,872 | B1 | 11/2002 | Chae et al. |
| 6,482,262 | B1 | 11/2002 | Elers et al. |
| 6,482,733 | B2 | 11/2002 | Raaijmakers et al. |
| 6,482,740 | B2 | 11/2002 | Soininen et al. |
| 6,489,214 | B2 | 12/2002 | Kim et al. |
| 6,500,603 | B1 | 12/2002 | Shioda |
| 6,511,539 | B1 | 1/2003 | Raaijmakers |
| 6,534,395 | B2 | 3/2003 | Werkhoven et al. |
| 6,548,424 | B2 | 4/2003 | Putkonen |
| 6,551,929 | B1 | 4/2003 | Kori et al. |
| 6,561,484 | B2 | 5/2003 | Nakagawa et al. |
| 6,569,501 | B2 | 5/2003 | Chiang et al. |
| 6,583,497 | B2 | 6/2003 | Xia et al. |
| 6,585,823 | B1 | 7/2003 | Van Wijck |
| 6,599,572 | B2 | 7/2003 | Saanila et al. |
| 6,599,819 | B1 | 7/2003 | Goto |
| 6,607,976 | B2 | 8/2003 | Chen et al. |
| 6,619,304 | B2 | 9/2003 | Worm |
| 6,620,670 | B2 | 9/2003 | Song et al. |
| 6,620,723 | B1 | 9/2003 | Byun et al. |
| 6,620,956 | B2 | 9/2003 | Chen et al. |
| 6,630,201 | B2 | 10/2003 | Chiang et al. |
| 6,632,279 | B1 | 10/2003 | Ritala et al. |
| 6,657,304 | B1 | 12/2003 | Woo et al. |
| 6,660,660 | B2 | 12/2003 | Haukka et al. |
| 6,686,271 | B2 | 2/2004 | Raaijmakers et al. |
| 6,740,585 | B2 | 5/2004 | Yoon et al. |
| 6,780,777 | B2 | 8/2004 | Yun et al. |
| 6,797,336 | B2 * | 9/2004 | Garvey ................. C30B 29/605 |
| | | | 427/586 |
| 6,797,340 | B2 | 9/2004 | Fang et al. |
| 6,809,026 | B2 | 10/2004 | Yoon et al. |
| 6,825,115 | B1 | 11/2004 | Xiang et al. |
| 6,827,978 | B2 | 12/2004 | Yoon et al. |
| 6,833,161 | B2 | 12/2004 | Wang et al. |
| 6,841,432 | B1 | 1/2005 | Takemura et al. |
| 6,849,122 | B1 | 2/2005 | Fair |
| 6,855,368 | B1 | 2/2005 | Kori et al. |
| 6,867,130 | B1 | 3/2005 | Karlsson et al. |
| 6,867,152 | B1 | 3/2005 | Hausmann et al. |
| 6,889,627 | B1 | 5/2005 | Hao |
| 6,897,118 | B1 | 5/2005 | Poon et al. |
| 6,936,538 | B2 | 8/2005 | Byun |

(56) References Cited

U.S. PATENT DOCUMENTS

| | | |
|---|---|---|
| 6,939,804 B2 | 9/2005 | Lai et al. |
| 6,969,448 B1 | 11/2005 | Lau |
| 7,033,922 B2 | 4/2006 | Kori et al. |
| 7,055,333 B2 | 6/2006 | Leitch et al. |
| 7,084,079 B2 | 8/2006 | Conti et al. |
| 7,101,795 B1 | 9/2006 | Xi et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,115,494 B2 | 10/2006 | Sinha et al. |
| 7,115,499 B2 | 10/2006 | Wang et al. |
| 7,211,144 B2 | 5/2007 | Lu et al. |
| 7,211,525 B1 | 5/2007 | Shanker et al. |
| 7,235,486 B2 | 6/2007 | Kori et al. |
| 7,238,552 B2 | 7/2007 | Byun |
| 7,282,458 B2 | 10/2007 | Gates et al. |
| 7,361,231 B2 | 4/2008 | Fury et al. |
| 7,384,867 B2 | 6/2008 | Lai et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,516 B2 | 9/2008 | Wang et al. |
| 7,432,200 B2 | 10/2008 | Chowdhury et al. |
| 7,460,760 B2 | 12/2008 | Cho et al. |
| 7,465,650 B2 | 12/2008 | Derderian |
| 7,465,666 B2 | 12/2008 | Kori et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,629,227 B1 | 12/2009 | Wang et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,674,715 B2 | 3/2010 | Kori et al. |
| 7,691,442 B2 | 4/2010 | Gandikota et al. |
| 7,695,563 B2 | 4/2010 | Lu et al. |
| 7,709,320 B2 | 5/2010 | Cheng |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,759,749 B2 | 7/2010 | Tanikawa |
| 7,825,038 B2 | 11/2010 | Ingle et al. |
| 7,825,042 B2 | 11/2010 | Mandal |
| 7,846,840 B2 | 12/2010 | Kori et al. |
| 7,867,914 B2 | 1/2011 | Xi et al. |
| 7,867,923 B2 | 1/2011 | Mallick et al. |
| 7,891,228 B2 | 2/2011 | Ding et al. |
| 7,910,165 B2 | 3/2011 | Ganguli et al. |
| 7,964,505 B2 | 6/2011 | Khandelwal et al. |
| 7,964,506 B1 | 6/2011 | Ponnuswamy et al. |
| 8,027,089 B2 | 9/2011 | Hayashi |
| 8,278,224 B1 | 10/2012 | Mui et al. |
| 8,306,026 B2 | 11/2012 | Anjum et al. |
| 8,318,584 B2 | 11/2012 | Li et al. |
| 8,319,295 B2 | 11/2012 | Collaert et al. |
| 8,349,085 B2 | 1/2013 | Tahara et al. |
| 8,449,942 B2 | 5/2013 | Liang et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,536,656 B2 | 9/2013 | Ramachandran et al. |
| 8,557,712 B1 | 10/2013 | Antonelli et al. |
| 8,563,445 B2 | 10/2013 | Liang et al. |
| 8,585,873 B2 | 11/2013 | Ford et al. |
| 8,647,992 B2 | 2/2014 | Liang et al. |
| 8,648,253 B1 | 2/2014 | Woods et al. |
| 8,668,868 B2 * | 3/2014 | Chiu ................. B01D 53/38 |
| | | 210/600 |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 * | 9/2015 | Yamamoto ........ H01L 21/67126 |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,343,372 B1 | 5/2016 | Bao et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 * | 11/2016 | Bao ................. H01L 29/42372 |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0059538 A1 | 3/2003 | Chung et al. |

(56) References Cited

U.S. PATENT DOCUMENTS

| | | |
|---|---|---|
| 2003/0101938 A1 | 6/2003 | Ronsse et al. |
| 2003/0121887 A1 | 7/2003 | Garvey et al. |
| 2003/0123216 A1 | 7/2003 | Yoon et al. |
| 2003/0129832 A1 | 7/2003 | Fujikawa |
| 2003/0148035 A1 | 8/2003 | Lingampalli |
| 2003/0148631 A1 | 8/2003 | Kuo et al. |
| 2003/0157760 A1 | 8/2003 | Xi et al. |
| 2003/0194615 A1 | 10/2003 | Krauth |
| 2003/0194825 A1 | 10/2003 | Law et al. |
| 2003/0207593 A1 | 11/2003 | Derderian et al. |
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0097060 A1 | 5/2004 | San et al. |
| 2004/0112409 A1 | 6/2004 | Schilling |
| 2004/0180510 A1 | 9/2004 | Ranade |
| 2004/0184792 A1 | 9/2004 | Hamelin et al. |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0014365 A1 | 1/2005 | Moon et al. |
| 2005/0022737 A1 | 2/2005 | Shimizu et al. |
| 2005/0051194 A1 | 3/2005 | Sakashita et al. |
| 2005/0074956 A1 | 4/2005 | Autryve et al. |
| 2005/0082281 A1 | 4/2005 | Uemori et al. |
| 2005/0109392 A1 | 5/2005 | Hollars |
| 2005/0136684 A1 | 6/2005 | Mukai et al. |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0040052 A1 | 2/2006 | Fang et al. |
| 2006/0079086 A1 | 4/2006 | Boit et al. |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0240187 A1 | 10/2006 | Weidman |
| 2006/0279025 A1 | 12/2006 | Heidari et al. |
| 2006/0290017 A1 | 12/2006 | Yanagisawa |
| 2007/0009658 A1 | 1/2007 | Yoo et al. |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0095651 A1 | 5/2007 | Ye et al. |
| 2007/0099415 A1 | 5/2007 | Chen et al. |
| 2007/0111519 A1 | 5/2007 | Lubomirsky et al. |
| 2007/0116873 A1 | 5/2007 | Li et al. |
| 2007/0145416 A1 | 6/2007 | Ohta |
| 2007/0187386 A1 | 8/2007 | Kim et al. |
| 2007/0204797 A1 | 9/2007 | Fischer |
| 2007/0209931 A1 | 9/2007 | Miller |
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2008/0001196 A1 | 1/2008 | Cheng |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0115726 A1 | 5/2008 | Ingle et al. |
| 2008/0121882 A1 | 5/2008 | Hwang et al. |
| 2008/0132050 A1 | 6/2008 | Lavoie |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1* | 10/2008 | Yu ..................... H01L 21/76877 |
| | | 438/655 |
| 2008/0311711 A1 | 12/2008 | Hampp et al. |
| 2008/0315762 A1 | 12/2008 | Hamada et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0060702 A1* | 3/2009 | Kobayashi .......... H01L 21/6719 |
| | | 414/805 |
| 2009/0081884 A1 | 3/2009 | Yokota et al. |
| 2009/0087981 A1 | 4/2009 | Suzuki et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0072569 A1 | 3/2010 | Han et al. |
| 2010/0102417 A1 | 4/2010 | Ganguli et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0248419 A1 | 9/2010 | Woodruff et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0198736 A1 | 8/2011 | Shero et al. |
| 2011/0204518 A1 | 8/2011 | Arunachalam |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0145185 A1 | 6/2012 | Roca I Cabarrocas et al. |
| 2012/0153483 A1 | 6/2012 | Akolkar et al. |
| 2012/0175711 A1 | 7/2012 | Ramachandran et al. |
| 2012/0175822 A1 | 7/2012 | Inamiya et al. |
| 2012/0252207 A1 | 10/2012 | Lei et al. |

(56)        References Cited

U.S. PATENT DOCUMENTS

| | | |
|---|---|---|
| 2012/0252210 A1 | 10/2012 | Tohnoe |
| 2012/0258602 A1 | 10/2012 | Subramani et al. |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2013/0068391 A1 | 3/2013 | Mazzocco et al. |
| 2013/0069174 A1 | 3/2013 | Chuang et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0203961 A1 | 7/2015 | Ha et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0348824 A1 | 12/2015 | Kuenle et al. |
| 2015/0357195 A1 | 12/2015 | Lam et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0204027 A1 | 7/2016 | Lakshmanan et al. |
| 2016/0208414 A1 | 7/2016 | Odawara et al. |
| 2016/0260526 A1 | 9/2016 | Otto |
| 2016/0268127 A1 | 9/2016 | Yamazaki |
| 2016/0273758 A1 | 9/2016 | Fujimura |
| 2016/0274454 A1 | 9/2016 | Beasley et al. |
| 2016/0284882 A1 | 9/2016 | Jang |
| 2016/0308048 A1 | 10/2016 | Ching et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0182856 A1 | 6/2018 | Lee |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0342396 A1 | 11/2018 | Wong et al. |
| 2018/0350563 A1 | 12/2018 | Manna et al. |
| 2018/0366328 A1 | 12/2018 | Ren et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |

(56) References Cited

U.S. PATENT DOCUMENTS

| | | | |
|---|---|---|---|
| 2019/0198367 A1 | 6/2019 | Liang et al. | |
| 2019/0198368 A1 | 6/2019 | Weaver et al. | |
| 2019/0228982 A1 | 7/2019 | Chen et al. | |
| 2019/0229004 A1 | 7/2019 | Schaller et al. | |
| 2019/0237345 A1 | 8/2019 | Delmas et al. | |
| 2019/0258153 A1 | 8/2019 | Nemani et al. | |
| 2019/0259625 A1 | 8/2019 | Nemani et al. | |
| 2019/0259638 A1 | 8/2019 | Schaller et al. | |
| 2019/0279879 A1 | 9/2019 | Singh et al. | |
| 2019/0311896 A1 | 10/2019 | Balseanu et al. | |
| 2019/0326138 A1 | 10/2019 | Forderhase et al. | |
| 2019/0360100 A1 | 11/2019 | Nguyen et al. | |
| 2019/0360633 A1 | 11/2019 | Schaller et al. | |
| 2019/0368035 A1 | 12/2019 | Malik et al. | |
| 2019/0371650 A1 | 12/2019 | Sun et al. | |
| 2019/0375105 A1 | 12/2019 | Weaver et al. | |
| 2020/0035509 A1 | 1/2020 | Khan et al. | |
| 2020/0035513 A1 | 1/2020 | Khan et al. | |
| 2020/0075392 A1 | 3/2020 | Brown et al. | |
| 2020/0098574 A1 | 3/2020 | Wong et al. | |
| 2021/0167235 A1 | 6/2021 | Li et al. | |
| 2021/0214842 A1* | 7/2021 | Yoon ....................... | C23C 16/02 |

FOREIGN PATENT DOCUMENTS

| | | | |
|---|---|---|---|
| CN | 104047676 A | 9/2014 |
| CN | 104089491 A | 10/2014 |
| CN | 103035513 B | 10/2016 |
| EP | 0418592 A1 | 3/1991 |
| EP | 0516344 A1 | 12/1992 |
| EP | 0670590 A2 | 9/1995 |
| EP | 1069213 A2 | 1/2001 |
| EP | 1107288 A2 | 6/2001 |
| EP | 1139418 A2 | 10/2001 |
| EP | 0840365 A3 | 10/2003 |
| JP | S63-004616 A | 1/1988 |
| JP | S6367721 A | 3/1988 |
| JP | H1218018 A | 8/1989 |
| JP | H04355922 A | 12/1992 |
| JP | H0521347 A | 1/1993 |
| JP | H06283496 A | 10/1994 |
| JP | H07048489 B2 | 5/1995 |
| JP | H07158767 A | 6/1995 |
| JP | 108195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11354515 A | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 200351474 A | 2/2003 |
| JP | 2003166065 A | 6/2003 |
| JP | 2003188387 A | 7/2003 |
| JP | 2004127958 A | 4/2004 |
| JP | 200579528 A | 3/2005 |
| JP | 2005064269 A | 3/2005 |
| JP | 2005530343 A | 10/2005 |
| JP | 2005333015 A | 12/2005 |
| JP | 2006526125 A | 11/2006 |
| JP | 2007242791 A | 9/2007 |
| JP | 2008073611 A | 4/2008 |
| JP | 2008118118 A | 5/2008 |
| JP | 2008153635 A | 7/2008 |
| JP | 2009129927 A | 6/2009 |
| JP | 2009539231 A | 11/2009 |
| JP | 201080949 A | 4/2010 |
| JP | 2010168607 A | 8/2010 |
| JP | 2010205854 A | 9/2010 |
| JP | 201129394 A | 2/2011 |
| JP | 2011-258943 A | 12/2011 |
| JP | 2012503883 A | 2/2012 |
| JP | 2012204656 A | 10/2012 |
| JP | 2013105777 A | 5/2013 |
| JP | 2013516788 A | 5/2013 |
| JP | 2013179244 A | 9/2013 |
| JP | 2014019912 A | 2/2014 |
| JP | 2014103351 A | 6/2014 |
| JP | 2015067884 A | 4/2015 |
| JP | 2015086459 A | 5/2015 |
| JP | 2015115394 A | 6/2015 |
| JP | 2015233157 A | 12/2015 |
| KR | 19980063671 A | 10/1998 |
| KR | 20010046843 A | 6/2001 |
| KR | 20030052162 A | 6/2003 |
| KR | 100422433 B1 | 7/2004 |
| KR | 10-20040068969 A | 8/2004 |
| KR | 20050121750 A | 12/2005 |
| KR | 100684910 B1 | 2/2007 |
| KR | 20070073367 * | 7/2007 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140104112 A | 8/2014 |
| KR | 101438291 B1 | 9/2014 |
| KR | 20140135744 A | 11/2014 |
| KR | 20150006587 A | 1/2015 |
| KR | 20150122432 A | 11/2015 |
| KR | 20160044004 A | 4/2016 |
| KR | 20160061437 A | 5/2016 |
| TW | 200529284 A | 9/2005 |
| TW | 200721316 A | 6/2007 |
| TW | 201507174 A | 2/2015 |
| TW | 201608672 A | 3/2016 |
| TW | 201708597 A | 3/2017 |
| WO | 200051938 A1 | 9/2000 |
| WO | 03023827 A1 | 3/2003 |
| WO | 2004102055 A1 | 11/2004 |
| WO | 2005057663 A2 | 6/2005 |
| WO | 2008047886 A1 | 4/2008 |
| WO | 2008089178 A2 | 7/2008 |
| WO | 2010115128 A3 | 1/2011 |
| WO | 2011002058 A1 | 1/2011 |
| WO | 2011103062 A2 | 8/2011 |
| WO | 2012133583 A1 | 10/2012 |
| WO | 2014115600 A1 | 7/2014 |
| WO | 2015195081 A1 | 12/2015 |
| WO | 2016018593 A1 | 2/2016 |
| WO | 2016065219 A1 | 4/2016 |
| WO | 2016111833 A1 | 7/2016 |
| WO | 2018187546 A1 | 10/2018 |

OTHER PUBLICATIONS

Office Action for Japanese Patent Application No. 2020-543976 dated Jul. 13, 2021.

Taiwan Office Action dated Jul. 28, 2021 for Application No. 107108016.

International Search Report and Written Opinion for International Application No. PCT/US2019/032609 dated Sep. 11, 2019.

Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.

EPO Extended European Search Report dated Aug. 9, 2019, for European Patent Application No. 19166775.7.

Japanese Office Action dated Mar. 17, 2020, for Japanese Patent Application No. 2019-073230.

Taiwan Office Action dated Mar. 31, 2020, for Taiwan Patent Application No. 108111883.

Korean Office Action dated Aug. 4, 2020, for Korean Patent Application No. 10-2019-0040236.

(56)　　　　References Cited

OTHER PUBLICATIONS

Japanese Office Action dated Nov. 10, 2020, for Japanese Patent Application No. 2019-073230.
T. Miyake et al., "Effects of atomic hydrogen on Cu reflow process", AIP Conferenec Proceedings 418, 419 (1998).
International Search Report and Written Opinion dated Aug. 24, 2017 for Application No. PCT/US2017/033862.
Taiwan Office Action for Application No. 106119184 dated Mar. 6, 2019.
Japanese Office Action for Application No. 2018-564195 dated Nov. 19, 2019.
PCT Notification of Transmittal of the International Search Report and the Written Opinion of the International Searching Authority for International Application No. PCT/US2019/061995; dated Mar. 9, 2020; 13 total pages.
International Search Report PCT/2020/046396 Dated Nov. 26, 2020 consists of 12 pages.
International Search Report and Written Opinion for PCT/US2021/014991 dated May 17, 2021.
Korean Office Action dated Aug. 26, 2021, for Korean Patent Application No. 10-2020-4016526.
Korean Office Action issued to Application No. 10-2019-7038099 on Apr. 21, 2022.
Japanese Office Action dated Oct. 4, 2022 for Application No. 2021-165335.
Chinese Office Action dated Nov. 23, 2022 for Application No. 201880034565.8.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.

International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136151.
International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
Taiwan Office Action dated Oct. 12, 2020 for Application No. 108140559.
Office Action for Japanese Application No. 2019-548976 dated Oct. 20, 2020.
European International Search Report issued to 18764622.9 on Nov. 20, 2020.
Office Action for Korean Application No. 10-2019-7029776 dated Jan. 18, 2021.
Japanese Office Action dated Feb. 16, 2021 for Application No. 2019-564964.
Extended European International Search Report issued to 18831823.2 dated Mar. 19, 2021.
Office Action for Korean Application No. 10-2020-7004396 dated Apr. 5, 2021.
Japanese Office Action dated Apr. 20, 2021 for Application No. JP 2020-508603.
Korean Office Action issued to Application No. 10-2019-7038099 on May 1, 2021.
Office Action for Japanese Patent Application No. 2019-548976 dated May 25, 2021.
Office Action for Japanese Patent Application No. 2020-500629 dated Jun. 8, 2021.
Extended European Search Report for EP Application No. 18876650.5 dated Jul. 19, 2021.
Extended European Search Report for EP Application No. 18806169.1 dated Jul. 19, 2021.
Korean Office Action dated Jul. 16, 2021 for Application No. 10-2020-7007956.
Intention to grant from European Patent Application No. 18806169.1 dated Jan. 20, 2026.

* cited by examiner

200

Support the workpiece in the chamber

202

Introduce a hydrogen gas into the chamber

204

Establish a pressure of at least 5 atmospheres in the chamber

206

Expose tungsten film to the hydrogen gas while pressure in the chamber is at least 5 atmospheres

208

TUNGSTEN DEFLUORINATION BY HIGH PRESSURE TREATMENT

CROSS-REFERENCE TO RELATED APPLICATIONS

This application is a continuation of U.S. application Ser. No. 16/696,229, filed Nov. 26, 2019, which is a divisional of U.S. application Ser. No. 15/605,769, filed May 25, 2017, which are herein incorporated by reference.

BACKGROUND

Field

Embodiments relate to high pressure treatment of a tungsten film on a workpiece, such as a semiconductor wafer.

Description of the Related Art

Micro-electronic circuits and other micro-scale devices are generally manufactured by the sequential deposition and patterning of multiple layers on a substrate or wafer, such as a silicon or other semiconductor material wafer. For some applications, a metal film, e.g., tungsten, is deposited on the substrate to form micro-electronic or other micro-scale components or to provide electrical interconnects.

For some layers, to achieve desired material properties, the substrate is typically put through an annealing process in which the substrate is quickly heated, usually to about 200-500° C. and more typically to about 300-400° C. The substrate may be held at these temperatures for a relatively short time, e.g., 60-300 seconds. The substrate is then rapidly cooled, with the entire process usually taking only a few minutes. Annealing may be used to change the material properties of the layers on the substrate. Annealing may also be used to activate dopants, drive dopants between films on the substrate, change film-to-film or film-to-substrate interfaces, densify deposited films, or to repair damage from ion implantation.

As feature sizes for microelectronic devices and interconnects become smaller, the allowable defect rate decreases substantially. Some defects result from contaminants embedded in one or more of the layers.

SUMMARY

In one aspect, treating a tungsten film on a workpiece includes supporting the workpiece in a chamber, introducing a hydrogen gas into the chamber, establishing a pressure of at least 5 atmospheres in the chamber, and exposing the tungsten film on the workpiece to the hydrogen gas while the pressure in the chamber is at least 5 atmospheres.

Other embodiments of this aspect include corresponding systems, apparatus, and computer programs, configured to perform the actions of the methods, encoded on computer storage devices.

These and other embodiments can each optionally include one or more of the following features.

A temperature of the tungsten film may be raised to between 250-600° C. The temperature of the tungsten film may be raised by maintaining a support for the workpiece in the chamber at an elevated temperature. The temperature of the tungsten film may be raised before establishing the pressure in the chamber of at least 5 atmospheres.

Establishing the pressure in the chamber may include introducing the hydrogen gas and an inert gas to provide a gas mixture in the chamber. The hydrogen gas in the gas mixture in the chamber may be between 1-4% by volume percent of the gas mixture. The inert gas in the gas mixture in the chamber may include nitrogen and/or argon. The tungsten film may be exposed to the hydrogen gas while the hydrogen gas has a partial pressure of 1-10 bar.

The tungsten film may be a portion of a fabricated three-dimensional NAND (3D NAND) structure.

In another aspect, a method of forming tungsten on a workpiece includes depositing a tungsten film on the workpiece by chemical vapor deposition using a precursor gas containing tungsten and fluorine, and exposing the tungsten film on the workpiece to a hydrogen gas in a chamber while a pressure in the chamber is at least 5 atmospheres.

The tungsten film may be a portion of a three-dimensional NAND (3D NAND) in fabrication. The precursor gas may include tungsten hexafluoride. The tungsten film is raised to a temperature between 250-600° C. The chamber pressure may be established by introducing the hydrogen gas and an inert gas (e.g., argon and/or nitrogen) to provide a gas mixture in the chamber.

In another aspect, an annealing system includes a chamber body that defines a chamber, a support to hold a workpiece with an outer surface of the workpiece exposed to an environment in the chamber, a robot to insert the workpiece into the chamber, a first gas supply to provide a hydrogen gas, a pressure source coupled to the chamber to raise a pressure in the chamber to at least 5 atmospheres, and a controller coupled to the robot, the first gas supply, and the pressure source. The controller is configured to cause the robot to transport the workpiece having a tungsten film on it into the chamber, cause the gas supply to supply the hydrogen gas to the chamber, and cause the pressure source to raise a pressure in the chamber to at least 5 atmospheres while the workpiece is held on the support in the chamber.

The annealing system may include a heater to raise a temperature of the workpiece on the support to between 250-600° C. The heater may include a resistive heater embedded in the support, and/or the heater may be a radiative heater in a wall of the chamber body that is positioned to irradiate the workpiece on the support. The pressure source may include a pump.

The annealing system may include a second gas supply to supply an inert gas (e.g., argon and/or nitrogen) to the chamber, and the controller may be coupled to the second gas supply and may be configured to cause the first gas supply to introduce the hydrogen gas and the second gas supply to introduce the inert gas to provide a gas mixture in the chamber.

Particular embodiments of the subject matter described in this specification can be implemented so as to realize one or more of the following advantages. Post-deposition annealing of tungsten films can improve film quality by reducing the presence of fluorine in the tungsten films. Reducing fluorine can reduce the likelihood of defects and can increase yield. The use of high pressure gas for defluorination allows for lower temperatures during the anneal by improving the diffusion of the gas into the layers, maintaining a relatively low thermal budget for the post-processing of the workpiece and preserving overall layer structure quality. Additionally, lower temperatures for deposition may be used for depositing the tungsten films, thereby reducing layer intermixing resulting from higher temperature depositions.

The details of one or more embodiments are set forth in the accompanying drawings and the description below. Other features, objects, and advantages will be apparent from the description, drawings, and claims.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

In general, it is desirable to reduce defect densities of layers deposited on a workpiece, e.g., a deposited tungsten film on a semiconductor wafer, e.g., a semiconductor wafer being used for fabrication of a 3D NAND structure. Defect densities may arise in a variety of manners including residue from a precursor gas (e.g., tungsten hexafluoride) used in the deposition process of a tungsten film. Decreasing the residual fluorine in a deposited tungsten film can reduce detrimental effects such as unintentional oxide etches causing defects in adjacent layers and decreased k-value in gate oxides deposited adjacent to the tungsten film.

Described below are systems and methods for high pressure treatment to defluorinate a tungsten film using a high pressure anneal. A tungsten film deposited on a workpiece is exposed to high pressure (e.g., at least 5 atmospheres) of forming gas (e.g., 4% hydrogen gas mixed with an inert gas) while held at elevated temperatures (e.g., 300-500° C.) for a few minutes to an hour.

System

Figure 1:
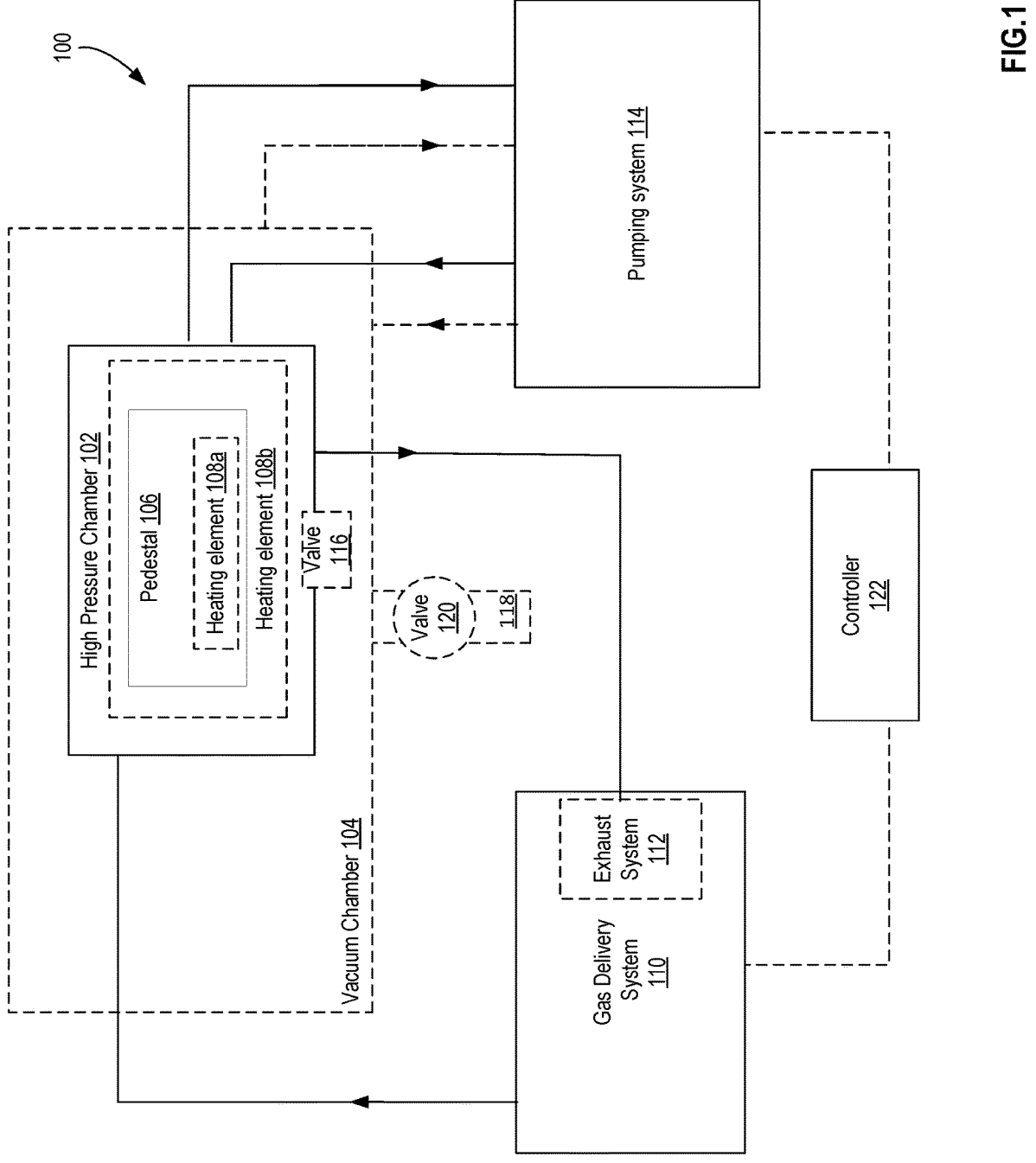
FIG. 1 is a block diagram of a high-pressure substrate processing system.

FIG. 1 is a block diagram of a high-pressure substrate processing system 100. The high-pressure substrate processing system 100 includes a high pressure chamber 102. The high pressure chamber 102 is configured to contain pressures of at least 5 atm, e.g., at least 10 atm, and can be capable of holding vacuum levels of up to $10^{-3}$ Torr. In some implementations, the high-pressure substrate processing system 100 includes a low-pressure environment 104, e.g., a vacuum chamber, for when a workpiece is being transferred between processing chambers (e.g., from another processing chamber into the high pressure chamber 102). The relative pressures within the high pressure chamber 102 and the low pressure chamber 104 can be controlled independently of each other.

A robot (not depicted in FIG. 1) including a robotic arm can be used to transfer the workpiece into and out of the high pressure chamber 102, e.g., between the chambers of a multi-chamber substrate processing tool.

The high pressure chamber 102 includes a support, for example, pedestal 106 for supporting a workpiece in the high pressure chamber 102. The pedestal 106 supports one or more workpieces using a variety of support mechanisms, for example, the pedestal 106 may support the workpiece with locking pins and springs, and/or the workpiece may rest directly on top of the pedestal 106.

In some implementations, the high pressure chamber 102 includes one or more heating elements 108. For example, heating element 108a is a resistive heater and is integrated into the pedestal 106 for heating the workpiece. In some implementations, the high pressure chamber 102 includes a heating element 108b, where the heating element 108b can heat and maintain a selected temperature within the high pressure chamber 102. Heating element 108b may be a radiative heater embedded in a wall of the high pressure chamber body, and positioned to irradiate the workpiece on the pedestal 106. The heat from the heating elements 108 can be sufficient to anneal the workpiece when the workpiece is supported on the pedestal 106 and a gas (if used) has been introduced into the high pressure chamber 102. The heating elements 108 may be resistive heating elements, and may heat the workpiece conductively and/or radiatively. Additionally, the heating elements 108 may include a discrete heating coil, or a radiative heater (e.g., an infrared lamp).

A gas delivery system 110 is operable to pressurize and depressurize the high pressure chamber 102. The gas delivery system 110 provides a gas mixture to the high pressure chamber 102 to establish a high pressure, e.g., a pressure of at least 5 atmospheres. In some implementations, the gas delivery system 110 includes an exhaust system 112 to exhaust the gas from the high pressure chamber 102 thereby depressurizing the high pressure chamber 102. The gas delivery system includes a pressure source to raise the pressure in the chamber 102 to the high pressure. The pressure source can include a pump, e.g., a rotary pump, a scroll pump, and/or a screw pump, configured to pump gas into the chamber 102 until the desired pressure is reached, and/or a compressed gas cylinder at a pressure sufficient that, after the gas cylinder is fluidically connected to the chamber 102, the equalized pressure will reach the desired pressure.

A pumping system 114 includes one or more pumps for reducing pressures in the high pressure chamber 102 and/or the vacuum chamber 104. Pumps may include a rotary pump, a scroll pump, and/or a screw pump. For example, the pumping system 114 can be used to lower the pressure in the vacuum chamber 104 to be at vacuum or near-vacuum pressure, e.g., less than 1 milliTorr. In another example, the pumping system 114 may be used during a pump and purge cycle in the high pressure chamber 102 to reduce presence of contaminants in the high pressure chamber 102 prior to process operation.

In some implementations, a valve assembly 116 isolates the relative pressures between the high pressure chamber 102 and the vacuum chamber 104. The high-pressure environment within the high pressure chamber 102 can thus be separated and sealed from the low pressure environment within the vacuum chamber 104. The valve assembly 116 is operable to enable the workpiece to be transferred directly between the high pressure chamber 102 and the vacuum chamber 104.

In some implementations, the high-pressure substrate processing system 100 includes a foreline 118 connected to the vacuum chamber 104 and connected to an outside environment. An isolation valve 120 is arranged along the foreline 118 to isolate the pressure within the vacuum chamber 104 from the pressure of the outside environment. The isolation valve 120 can be operated to adjust the pressure within the vacuum chamber 104 and to releases gases within the vacuum chamber 104. The isolation valve 120 can be operated in conjunction with the pumping system 114 to regulate the pressure within the vacuum chamber 104.

One or more operations of the high-pressure substrate processing system 100 may be controlled by one or more controllers 122. The controller 122, e.g., a general purpose programmable computer, is connected to and operable to control some or all of the various components of the high-pressure substrate processing system 100. Operations controlled by controller 122 may include, for example, temperature regulation of the heating elements 108 within the high pressure chamber 102, pressure regulation within the high pressure chamber 102, vacuum regulation within the vacuum chamber 104, flow rates and gas delivery by the gas delivery system 110, and operation of one or more pumps in the pumping system 114. For example, the controller 122 can be programmed to generate control signals that cause the components of the high-pressure substrate processing system 100 to carry out the process described below with reference to FIG. 2.

High-Pressure Treatment of a Tungsten Film

Figure 2:
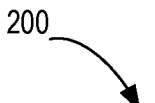
FIG. 2 is a flow diagram of an example process flow for tungsten defluorination by high pressure treatment in a high-pressure substrate processing system.
Figure 2:
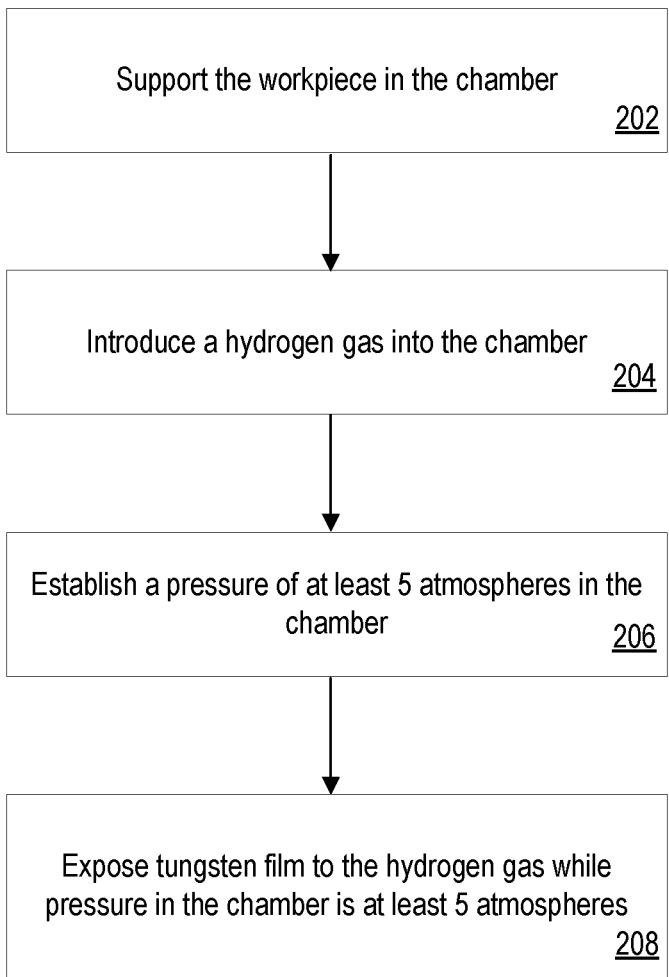

FIG. 2 is a flow diagram of an example process flow 200 for defluorination of a tungsten film on a workpiece by high pressure treatment in a high-pressure substrate processing system 100. In one example, a workpiece includes a semiconductor substrate (e.g., silicon), with a tungsten film deposited on the substrate. In some implementations, the tungsten film forms part of a 3D NAND structure fabricated on the substrate; the workpiece may also include layers of other materials (e.g., SiN, TiN). The tungsten film may be deposited on the workpiece using chemical vapor deposition (CVD) in a separate processing step. In some implementations, the tungsten film is deposited using atomic layer deposition (ALD).

The workpiece is inserted into the chamber, e.g., by the robot, and then supported in the chamber, e.g., on a pedestal 106 within the high pressure chamber 102 (202). In some implementations, the high pressure chamber 102 and/or the pedestal 106 are maintained at a particular temperature (e.g., 300-500° C.) using one or more heating elements 108. The temperature of the high pressure chamber 102 and/or the pedestal 106 may be established prior to introducing the workpiece into the high pressure chamber 102. Furthermore, the temperature of the workpiece (e.g., a tungsten film on a substrate) may be established at a particular temperature (e.g., 250-600° C.) through the use of one or more heating elements 108 while the workpiece is supported by the pedestal 106 in the high pressure chamber 102. In some implementations, the temperature of the workpiece (e.g., the tungsten film on the substrate) is raised prior to establishing the pressure in the high pressure chamber 102 of at least 5 atmospheres.

A hydrogen gas is introduced into the high pressure chamber 102 (204). The hydrogen gas can be of the form $H_2$ or deuterium gas ($D_2$). The hydrogen gas can be a portion of a forming gas that includes one or more inert gases (e.g., nitrogen and/or argon). In some implementations, the percentage of hydrogen gas in the forming gas is at least 1%, and at most 4.5%, by volume percent. The inert gas can be mixed with the hydrogen gas before being delivered into the high pressure chamber 102 by the gas delivery system 110, or the inert gas and the hydrogen gas can be delivered into the high pressure chamber 102 by separate nozzles of the gas delivery system 110, and mixed in the high pressure chamber 102.

The gas delivery system 110 can establish a total pressure (inert gas and hydrogen gas) of 5 to 50 atmospheres in the high pressure chamber 102 (206). In some implementations, the total pressure in the high pressure chamber 102 is at least 10 atmospheres. Pressure in the high pressure chamber 102 may be established as a static pressure. In some implementations, the pressure in the high pressure chamber is established by a flow of forming gas through an inlet/outlet of the gas delivery system 110 into the high pressure chamber 102. In some implementations, the tungsten film is exposed to the hydrogen gas while the hydrogen gas has a partial pressure of 1-10 bar.

After the desired pressured is established in the high pressure chamber 102, the tungsten film on the workpiece is exposed to the hydrogen gas while the high pressure chamber 102 is maintained at the elevated pressure (208). Exposure times include a few minutes to several hours (e.g., at least 5 minutes, and no more than one hour). In some implementations, the annealing temperature (e.g., temperature of the workpiece during the anneal process), hydrogen partial pressure in the high pressure chamber 102, and exposure times for the defluorination process, may be interrelated such that optimal operational parameters may be found by adjusting the aforementioned (and other) variables.

Without being limited to any particular theory, the molecular hydrogen gas cracks on the surface of the heated tungsten film into atomic hydrogen and then diffuses along the grain boundaries of the tungsten film. Diffusion of the reactants (e.g., cracked hydrogen) into the tungsten film may be a limiting factor for the rate with which the defluorination process occurs. As the cracked hydrogen diffuses into the tungsten film, the cracked hydrogen bonds with fluorine on the surface or embedded within the tungsten film. The bonded hydrogen and fluorine form hydrogen fluoride which can then diffuse out of the tungsten film. The atomic hydrogen may additionally serve to weaken and break bonds between the fluorine and tungsten in the tungsten film.

In some implementations, the hydrogen gas is introduced into the high pressure chamber 102 by the gas delivery system 110 prior to or during the heating process of the workpiece. For example, a high pressure of hydrogen gas may be introduced into the high pressure chamber 102 while heating elements 108 are bringing a workpiece on pedestal 106 to a particular desired temperature.

In some implementations, the workpiece may be heated to a particular temperature while it is in the vacuum chamber 104 and then subsequently transferred to the high pressure chamber 102 by a robot (not depicted), where the hydrogen gas may be introduced.

In some implementations, a tungsten film is deposited on a workpiece, which may then undergo the high pressure treatment described herein. For example, a tungsten film can be deposited on the workpiece by chemical vapor deposition (CVD) using a precursor gas containing tungsten and fluorine (e.g., tungsten hexafluoride). In some implementations, tungsten hexachloride can be used as a precursor gas to deposit a tungsten film. An amount of residual fluorine trapped within the deposited tungsten film may depend, in part, on the temperature of deposition (e.g., lower deposition results in higher concentrations of residual fluorine). The tungsten film may then be exposed to a hydrogen gas in a high pressure chamber 102 while a pressure in the high pressure chamber 102 is at least 5 atmospheres.

Embodiments of High-Pressure Substrate Processing Systems

Figure 3:
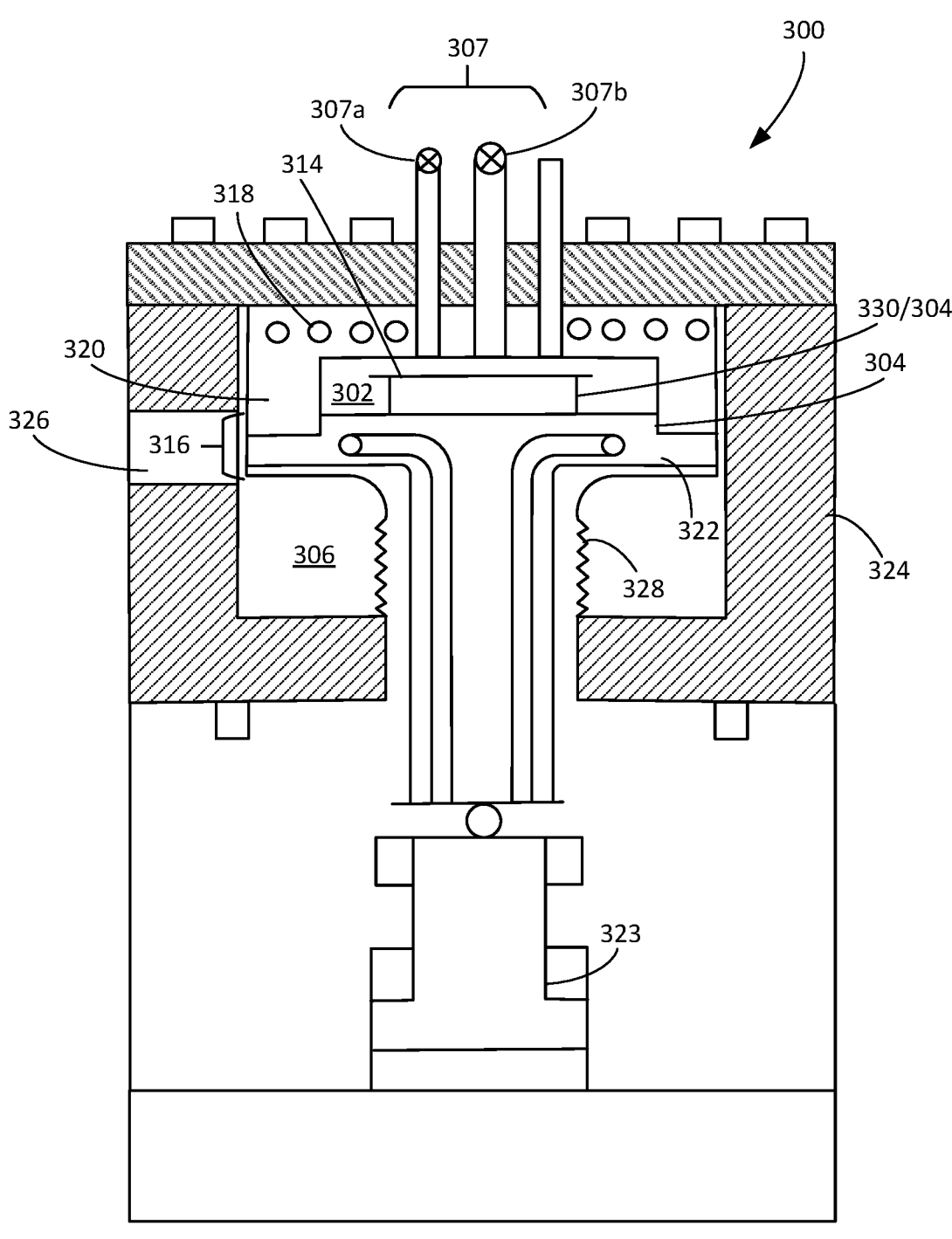
FIG. 3 depicts an example high-pressure substrate processing system.
Figure 4:
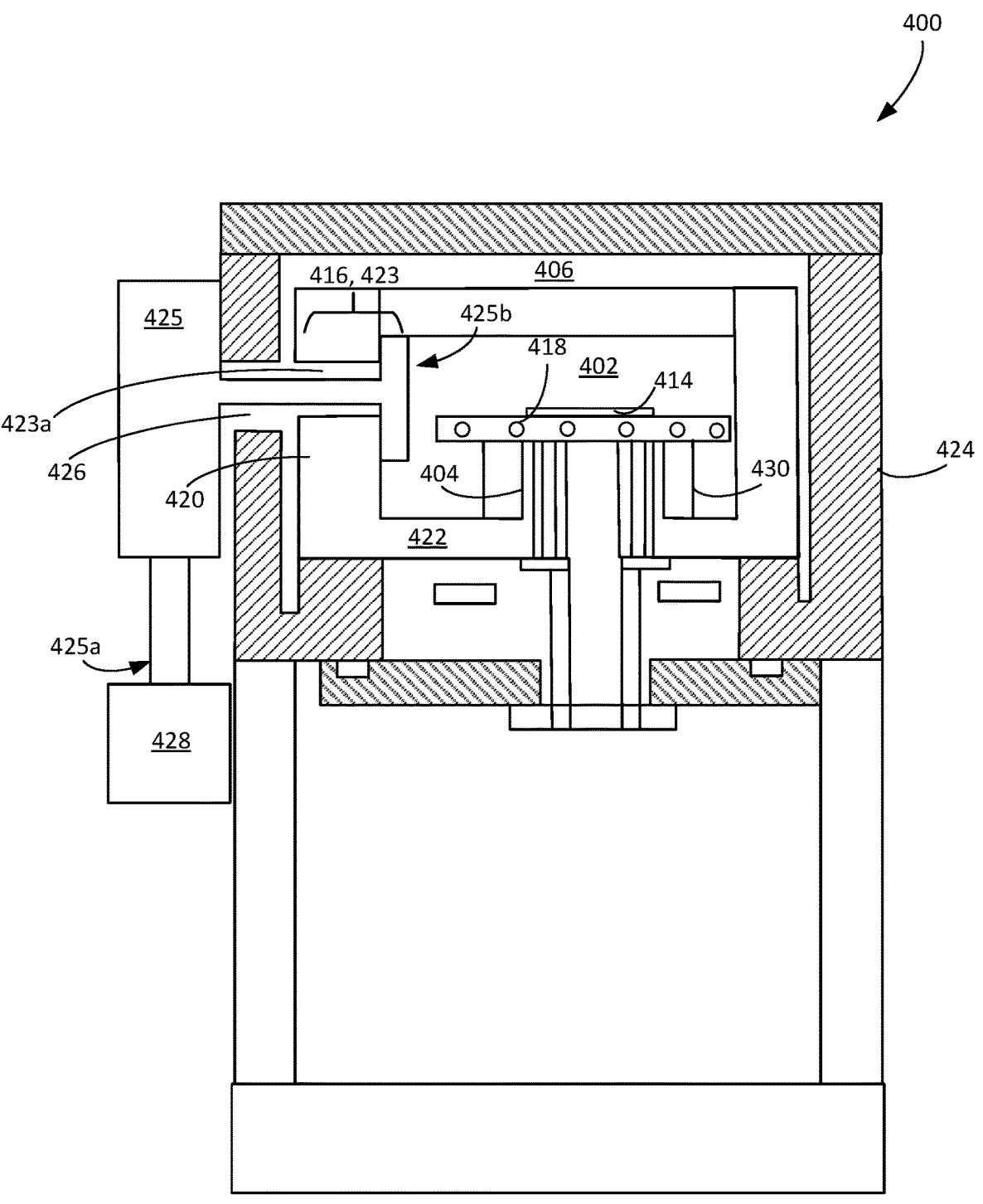
FIG. 4 depicts another example of a high-pressure substrate processing system.

FIGS. 3 and 4 depict two or more embodiments of high-pressure substrate processing systems. FIG. 3 depicts an example high-pressure substrate processing system 300 including a first chamber 302 (e.g., a high pressure chamber 102), a pedestal 304, a second chamber 306 (e.g., a vacuum chamber 104), and a controller (e.g., the controller 122). The high-pressure substrate processing system 300 further includes a pumping system (not shown) similar to the pumping system 114 and a gas delivery system 307 similar to the gas delivery system 110 described with respect to FIG. 1. For example, the gas delivery system 307 includes an input line 307a and an exhaust line 307b. The precursor gas is introduced into the first chamber 302 through the input line 307a, and the precursor gas is exhausted from the first chamber 302 through the exhaust line 307b.

The pedestal 304 supports a workpiece 314 on which a film of material (e.g., tungsten film) is to be defluorinated through a high pressure treatment. The pedestal 304 is positioned or positionable within the first chamber 302. In some implementations, the substrate 314 sits directly on a flat top surface of the pedestal. In some implementations, the substrate 314 sits on pins 330 that project from the pedestal.

The high-pressure substrate processing system 300 includes an inner wall 320, a base 322, and an outer wall 324. The first chamber 302 is provided by a volume within the inner wall 320, e.g., between the inner wall 320 and the base 322. The second chamber 304 is provided by a volume outside the inner wall 320, e.g., between the inner wall 320 and the outer wall 324.

The high-pressure substrate processing system 300 further includes a valve assembly 316 between the first chamber 302 and the second chamber 306 that provides the functionality of the valve assembly 116 of FIG. 1, e.g., it can be operated to isolate the first chamber 302 from the second chamber 306. For example, the valve assembly 316 includes the inner wall 320, the base 322, and an actuator 323 to move the base 322 relative to the inner wall 320. The actuator 323 can be controlled to drive the base 322 to move vertically, e.g., away from or toward the walls 320 defining the first chamber 302. A bellows 328 can be used to seal the second chamber 306 from the external atmosphere while permitting the base 322 to move vertically. The bellows 328 can extend from a bottom of the base 322 to a floor of the second chamber 306 formed by the outer wall 324.

When the valve assembly 316 is in a closed position, the base 322 contacts the walls 320 such that a seal is formed between the base 322 and the walls 320, thus separating the outer chamber 306 from the inner chamber 302. The actuator 323 is operated to drive the base 322 toward the inner walls 320 with sufficient force to form the seal. The seal inhibits air from the first high-pressure chamber 302 from being exhausted into the low-pressure second chamber 306.

When the valve assembly 316 is in an open position, the base 322 is spaced apart from the walls 320, thereby allowing air to be conducted between the first and second chambers 302, 306 and also allowing the substrate 314 to be accessed and transferred to another chamber.

Because the pedestal 304 is supported on the base 322, the pedestal 304 is thus also movable relative to the inner walls 320. The pedestal 304 can be moved to enable the substrate 314 to be more easily accessible by the transfer robot. For example, an arm of a transfer robot (not depicted) can extend through an aperture 326 in the outer wall 324. When the valve assembly 316 is in the open position, the robot arm can pass through the gap between the inner wall 320 and the base 322 to access the substrate 314.

In some implementations, the high-pressure substrate processing system 300 includes one or more heating elements 318 configured to apply heat to the substrate 314. The heat from the heating elements 318 can be sufficient to anneal the substrate 314 when the substrate 314 is supported on the pedestal 304 and the precursor gas (if used) has been introduced into the first chamber 302. The heating elements 318 may be resistive heating elements. The one or more heating elements 318 may be positioned in, e.g., embedded in, the inner walls 320 defining the first chamber 302. This heats the inner wall 320, causing radiative heat to reach the substrate 314. The substrate 314 can be held by the pedestal 304 in close proximity to the ceiling of inner wall to improve transmission of heat from the inner wall 320 to the substrate 314.

However, the one or more heating elements 318 may be arranged in other locations within the high-pressure substrate processing system 300, e.g., within the side walls rather than ceiling. An example of a heating element 318 includes a discrete heating coil. Instead of or in addition to a heater embedded in the inner walls 320, a radiative heater, e.g., an infrared lamp, can be positioned outside the first chamber 302 and direct infrared radiation through a window in the inner wall 320. Electrical wires connect an electrical source (not shown), such as a voltage source, to the heating element, and can connect the one or more heating elements 318 to the controller.

The controller is operably connected to the pumping system, the gas delivery system 307, and the valve assembly 316 for controlling operations to perform the high pressure treatment of a layer of material on the substrate 314. In some implementations, the controller may also be operably connected to other systems. For example, the controller can also be operably connected to one or more of the transfer robots (not depicted), the one or more heating elements 318, and/or the actuator 323. In some cases, the controller 122 shown in FIG. 1 includes the controller of the high-pressure substrate processing system 300.

In a process to perform a high pressure treatment of a layer of material on the substrate 314, the controller can operate the pumping system to depressurize the second chamber 306 to a low-pressure state, e.g., to a state in which the second chamber 306 has a pressure less than 1 atmosphere, to prepare for transfer of the substrate 314 through the second chamber 306. The low-pressure state can be a near-vacuum state, e.g., a pressure less than 1 milliTorr. The substrate 314 is moved through the second chamber 306 by a transfer robot (not shown), while the second chamber 306 is at the low-pressure so that contamination and oxidation of the substrate 314 can be inhibited.

The substrate 314 is transferred into the first chamber 302 for processing. To transfer the substrate 314 into the first chamber 302, the controller can operate the valve assembly 316, e.g., open the valve assembly 316 to provide an opening through which the substrate 314 can be transferred into the first chamber 302. The controller can operate the transfer robot to carry the substrate 314 into the first chamber 302 and to place the substrate 314 on the pedestal 304.

After the substrate 314 is transferred into the first chamber 302, the controller can operate the valve assembly 316 to close the opening, e.g., close the valve assembly 316, thereby isolating the first and second chambers 302, 306 from one another. With the valve assembly 316 closed, pressures in the first chamber 302 and the second chamber 306 can be set to different values. The controller can operate the gas delivery system 307 to introduce the hydrogen gas into the first chamber 302 to pressurize the first chamber 302. The introduction of the hydrogen gas can increase the pressure within the first chamber 302, for example, to 5 atmospheres or more.

The hydrogen gas and the proper temperature and pressure conditions in the first chamber 302 can cause the high pressure treatment of the material to occur, e.g., as described with reference to FIG. 2. During the high pressure treatment, the controller can operate the one or more heating elements 318 to add heat to the substrate 314 to facilitate the annealing of the layer of material on the substrate 314.

When the high pressure treatment is complete, the substrate 314 can be removed from the first chamber 302 using the transfer robot and, if necessary, the substrate 314 can be transferred to a subsequent process chamber or to the outside environment. Alternatively, the substrate 314 is transferred into a load lock chamber (not shown). To prepare for transfer of the substrate 314 out of the first chamber 302, the controller can operate the exhaust system of the gas delivery system 307 to depressurize the first chamber 302 before the valve assembly 316 is opened. In particular, before the substrate 314 is transferred out of the first chamber 202, the precursor gas is exhausted from the first chamber 302 to reduce the pressure within the first chamber 202. The pressure in the first chamber 302 can be reduced to a near-vacuum pressure such that the pressure differential between the first chamber 302 and the second chamber 306 can be minimized.

To enable the substrate 314 to be transferred out of the first chamber 302, the controller can open the valve assembly 316. The opened valve assembly 316 provides an opening through which the substrate 314 is moved to be transferred into the second chamber 306. In particular, the opened valve assembly 316 enables the substrate 314 to be transferred directly into the second chamber 306, e.g., into the low pressure environment of the second chamber 306.

FIG. 4 depicts another example of a high-pressure substrate processing system 400 including a first chamber 402 (e.g., high pressure chamber 102), a pedestal 404, a second chamber 406 (e.g., vacuum chamber 104), and a controller similar to controller 122 shown in FIG. 1. The high-pressure substrate processing system 400 is similar to the high-pressure substrate processing system 300 described with respect to FIG. 3; unless otherwise specified the various options and implementations are also applicable to this embodiment.

For example, the gas delivery system and the pumping system of the high-pressure substrate processing system 400 are operated in a similar manner to maintain the low and high pressure environments for a substrate 414 processed using the high-pressure substrate processing system 400. The second chamber 406 can be defined by volume between inner walls 420 and outer walls 424. In addition, the substrate 414 is also supportable on the pedestal 404 for processing within the first chamber 402. Again, the substrate can sit directly on the pedestal 404, or sit on lift pins 430 that extend through the pedestal.

The high-pressure substrate processing system 400 differs from the high-pressure substrate processing system 300 of FIG. 3 in a few regards. First, inner walls 420 defining the first chamber 402 are not movable relative to a base 422 defining the first chamber 402. The pedestal 404 is thus fixed relative to the inner walls 420 and the base 422. In some examples, the pedestal 404 is fixed to the base 422 defining the first chamber 402.

Rather than being arranged in the inner walls 420 of the first chamber 402, as is the case for the one or more heating elements 318 of the embodiment of FIG. 3, one or more heating elements 418 of the embodiment depicted in FIG. 4 are arranged within the pedestal 404. The substrate 414 is thus heated through contact with the pedestal 404.

The high-pressure substrate processing system 400 further includes a valve assembly 416 between the first chamber 402 and the second chamber 406 that, similar to the valve assembly 316 of FIG. 3, isolates the first chamber 402 from the second chamber 406. However, in contrast to the valve assembly 316, the valve assembly 416 is not formed by the walls 420 and the base 422 defining the first chamber 402, but rather is formed by an arm 425 movable relative to the inner walls 420 and the base 422 of the first chamber 402. The arm 425 can be movable relative to the inner walls 420 and the base 422 of the first chamber 402.

In particular, the valve assembly 416 includes a slit valve 423 between the first chamber 402 and the second chamber 406. The slit valve 423 includes a slit 423a and the arm 425. The slit 423a extends through one of the inner walls 420 of the first chamber 402. A proximal end 425a of the arm 425 is positioned outside of the first chamber 402 while a distal end 425b of the arm 425 is positioned within the first chamber 402. The proximal end 425a of the arm 425 can be positioned within the second chamber 406 and be driven by an actuator positioned within the second chamber 406. Alternatively, the proximal end 425a of the arm 425 is positioned outside of the second chamber 406 and is thus driven by an actuator 428 that is also positioned outside of the second chamber 406.

The arm 425 extends through the slit 423a and is movable relative to the walls 420 so that the arm 425 can be moved to a position in which it forms a seal with the walls 420. The actuator 428 is coupled to the proximal end 425a of the arm 425 and drives the distal end 425b of the arm 425 relative to the walls 420. The arm 425 is also movable vertically to cover or uncover the slit 423a. In particular, the proximal end 425a of the arm 425 can be or include a flange that extends substantially parallel to the adjacent inner surface of the inner wall 420. The arm 425 is also movable and driven laterally so that the distal end 425b of the arm 425 can engage or disengage the inner walls 420. The arm 425 can also extend through an aperture 426 in the outer wall 424.

Like the valve assembly 316, the valve assembly 416 is movable between an open position and a closed position. When the valve assembly 416 is in the closed position, the distal end 425b of the arm 425 covers the slit 426 and contacts one of the inner walls 420, thereby forming the seal to isolate the first chamber 402 from the second chamber 406. In particular, the distal end 425b of the arm 425, e.g., the flange, contacts an inner surface of the wall 420 defining the first chamber 402.

When the valve assembly 416 is in the open position, the distal end 425b of the arm 425 is spaced laterally apart from the inner walls 420, e.g., the inner surface of the inner walls 420. In addition, the distal end 425b of the arm 425 is positioned vertically so that the slit 426 is uncovered. The slit 426 thus provides an opening that enables fluidic communication between the first chamber 402 and the second chamber 406 and that also enables the substrate 414 to be moved in and out of the first chamber 402, e.g., by a robot as discussed above.

The controller can operate the high-pressure substrate processing system 400 in a manner similar to the process described with respect to the controller of the high-pressure substrate processing system 300 to transfer the substrate 414 into and out of the first chamber 402 and to perform the high pressure treatment on the layer of material on the substrate 414. In this process, to open and close the valve assembly 416, the controller can operate the actuator 428 to drive the arm 425.

An advantage of the configuration shown in FIG. 4 is that the pressure within the first chamber 402 helps force the distal end 425 of the arm 425 against the inner surface of the inner wall 420. Consequently, in contrast to the configuration shown in FIG. 3, the actuator can be less powerful.

The controller and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below. Accordingly, other embodiments are within the scope of the following claims.

What is claimed is:

1. An annealing system, comprising:
a heater;
a low-pressure outer chamber body;
a high-pressure inner chamber body within the low-pressure outer chamber body, the high-pressure inner chamber body comprising an inner wall having an inner surface that defines a chamber, the chamber configured to contain a workpiece with an outer surface of the workpiece exposed to an environment in the chamber;
a robot to insert the workpiece into the chamber;
a first gas supply to provide a hydrogen gas into the chamber;
a pressure source coupled to the chamber to raise a pressure in the chamber to at least 5 atmospheres; and
a controller coupled to the robot, the heater, the first gas supply, the pressure source, the controller configured:
to cause the robot to transport the workpiece across the low-pressure outer chamber body and the high-pressure inner chamber body, the workpiece having a tungsten film thereon, the tungsten film comprising fluorine;
to cause the first gas supply to supply the hydrogen gas to the chamber,
to cause the heater to heat the tungsten film;
to cause exposure of the tungsten film with the hydrogen gas and form atomic hydrogen on the tungsten film;
to cause the pressure source to raise the pressure in the environment of the chamber to at least 5 atmospheres while the workpiece is held in the chamber; and
to cause formation of hydrogen fluoride from the atomic hydrogen and the fluorine.

2. The annealing system of claim 1, wherein:
the annealing system further comprises a valve assembly, the valve assembly comprising:
a slit valve between the high-pressure inner chamber body and the low-pressure outer chamber body, the slit valve comprising a slit extending through the inner wall of the high-pressure inner chamber body;
an arm extending through an aperture of an outer wall of the low-pressure outer chamber body and through the slit, the arm having a distal end inside the high-pressure inner chamber body and a proximal end outside of the low-pressure outer chamber body, the arm movable relative to the inner wall of the high-pressure inner chamber body to a position in which it forms a seal with the inner wall of the high-pressure inner chamber body,
wherein the valve assembly is movable between:
an open position where the distal end of the arm is spaced laterally apart from the inner surface of the inner wall of the high-pressure inner chamber body, and where the distal end of the arm is positioned vertically so that the aperture of the outer wall is uncovered; and
a closed position where the distal end of the arm covers the aperture of the outer wall and contacts the inner surface of the inner wall of the high-pressure inner chamber body:
the controller is further coupled to the arm; and
the controller is further configured to cause movement of the arm to open and to close the valve assembly, wherein closing the valve assembly isolates the high-pressure inner chamber body from the low-pressure outer chamber body.

3. The annealing system of claim 1, wherein the heater comprises a radiative heater in a wall of the high-pressure inner chamber body and positioned to irradiate the workpiece placed on a support within the chamber.

4. The annealing system of claim 1, comprising a second gas supply to supply an inert gas to the chamber, and wherein the controller is coupled to the second gas supply and is configured to cause the first gas supply to introduce the hydrogen gas and the second gas supply to introduce the inert gas to provide a gas mixture in the chamber.

5. The annealing system of claim 4, wherein the gas mixture comprises no greater than 4.5% by volume percent of the hydrogen gas.

6. The annealing system of claim 5, wherein the gas mixture comprises at least 1% by volume percent of the hydrogen gas.

7. The annealing system of claim 4, wherein the inert gas comprises nitrogen, argon, or a combination thereof.

8. The annealing system of claim 1, wherein the heater is configured to heat the workpiece to a temperature of about 250° C. to about 600° C.

9. The annealing system of claim 1, wherein the tungsten film is a portion of a 3D NAND in fabrication.

10. An annealing system, comprising:
a heater;
a low-pressure outer chamber body;
a high-pressure inner chamber body within the low-pressure outer chamber body, the high-pressure inner chamber body comprising an inner wall having an inner surface that defines a chamber, the chamber configured to contain a workpiece with an outer surface of the workpiece exposed to an environment in the chamber;
a valve assembly, the valve assembly comprising:
a slit valve between the high-pressure inner chamber body and the low-pressure outer chamber body, the slit valve comprising a slit extending through the inner wall of the high-pressure inner chamber body;
an arm extending through an aperture of an outer wall of the low-pressure outer chamber body and through the slit, the arm having a distal end inside the high-pressure inner chamber body and a proximal end outside of the low-pressure outer chamber body, the arm movable relative to the inner wall of the high-pressure inner chamber body to a position in which it forms a seal with the inner wall of the high-pressure inner chamber body,
wherein the valve assembly is movable between:
an open position where the distal end of the arm is spaced laterally apart from the inner surface of the inner wall of the high-pressure inner chamber body, and where the distal end of the arm is positioned vertically so that the aperture of the outer wall is uncovered; and
a closed position where the distal end of the arm covers the aperture of the outer wall and contacts the inner surface of the inner wall of the high-pressure inner chamber body:
a first gas supply to provide a hydrogen gas into the chamber;
a pressure source coupled to the chamber to raise a pressure in the chamber to at least 5 atmospheres; and
a controller coupled to the heater, the first gas supply, the pressure source, and the arm, the controller configured:

to cause the first gas supply to supply the hydrogen gas to the chamber;
to cause the heater to heat a tungsten film disposed on the workpiece positioned in the chamber, the tungsten film comprising fluorine;
to cause exposure of the tungsten film with the hydrogen gas and form atomic hydrogen on the tungsten film;
to cause the pressure source to raise the pressure in the environment of the chamber to at least 5 atmospheres while the workpiece is held in the chamber;
to cause formation of hydrogen fluoride from the atomic hydrogen and the fluorine;
to cause movement of the arm to open and to close the valve assembly, wherein closing the valve assembly isolates the high-pressure inner chamber body from the low-pressure outer chamber body; and
to cause the workpiece to cross the low-pressure outer chamber body and the high-pressure inner chamber body in the open position.

11. The annealing system of claim 10, wherein the heater comprises a resistive heater embedded in a support for holding the workpiece.

12. The annealing system of claim 10, wherein the heater comprises a radiative heater in a wall of the high-pressure inner chamber body and positioned to irradiate the workpiece placed on a support within the chamber.

13. The annealing system of claim 10, comprising a second gas supply to supply an inert gas to the chamber, and wherein the controller is coupled to the second gas supply and is configured to cause the first gas supply to introduce the hydrogen gas and the second gas supply to introduce the inert gas to provide a gas mixture in the chamber.

14. The annealing system of claim 13, wherein the gas mixture comprises no greater than 4.5% by volume percent of the hydrogen gas.

15. The annealing system of claim 14, wherein the gas mixture comprises at least 1% by volume percent of the hydrogen gas.

16. The annealing system of claim 13, wherein the inert gas comprises nitrogen, argon, or a combination thereof.

17. The annealing system of claim 10, wherein the heater is configured to heat the workpiece to a temperature of about 250° C. to about 600° C.

18. The annealing system of claim 10, wherein the tungsten film is a portion of a 3D NAND in fabrication.

19. The annealing system of claim 10, further comprising a robot to insert the workpiece into the chamber.

20. The annealing system of claim 19, wherein the controller is coupled to the robot and configured to cause the robot to transport the workpiece containing the tungsten film into the chamber, and wherein the heater is configured to heat the workpiece to a temperature of about 250° C. or greater.

* * * * *